(12) United States Patent
Lee et al.

(10) Patent No.: US 12,062,572 B2
(45) Date of Patent: Aug. 13, 2024

(54) SEMICONDUCTOR DEVICE HAVING METALLIZATION LAYER WITH LOW CAPACITANCE AND METHOD FOR MANUFACTURING THE SAME

(71) Applicant: TAIWAN SEMICONDUCTOR MANUFACTURING COMPANY, LTD., Hsinchu (TW)

(72) Inventors: Cheng-Chin Lee, Hsinchu (TW); Ting-Ya Lo, Hsinchu (TW); Chi-Lin Teng, Hsinchu (TW); Cherng-Shiaw Tsai, Hsinchu (TW); Shao-Kuan Lee, Hsinchu (TW); Kuang-Wei Yang, Hsinchu (TW); Gary Liu, Hsinchu (TW); Hsin-Yen Huang, Hsinchu (TW); Hsiao-Kang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 136 days.

(21) Appl. No.: 17/674,064

(22) Filed: Feb. 17, 2022

(65) Prior Publication Data
US 2023/0260831 A1 Aug. 17, 2023

(51) Int. Cl.
*H01L 21/768* (2006.01)
*H01L 23/532* (2006.01)
*H01L 23/522* (2006.01)

(52) U.S. Cl.
CPC ...... *H01L 21/7682* (2013.01); *H01L 23/5329* (2013.01); *H01L 23/5226* (2013.01); *H01L 23/53295* (2013.01)

(58) Field of Classification Search
CPC ............. H01L 21/7682; H01L 23/5329; H01L 21/76819; H01L 21/76832; H01L 21/76885; H01L 21/76834; H01L 23/53295; H01L 23/5226
See application file for complete search history.

(56) References Cited

U.S. PATENT DOCUMENTS

| | | | |
|---|---|---|---|
| 2018/0261546 A1* | 9/2018 | Bark | H01L 23/5226 |
| 2019/0019748 A1* | 1/2019 | Wallace | H01L 21/76834 |
| 2021/0125856 A1* | 4/2021 | Ahn | H01L 21/76801 |

* cited by examiner

*Primary Examiner* — Patricia D Valenzuela
(74) *Attorney, Agent, or Firm* — Birch, Stewart, Kolasch & Birch, LLP

(57) ABSTRACT

A method for manufacturing a semiconductor device includes: forming a first feature and a second feature extending in a normal direction transverse to a substrate; directionally depositing a dielectric material upon the features at an inclined angle relative to the normal direction so as to form a cap layer including a top portion disposed on a top surface of each of the features, and two opposite wall portions extending downwardly from two opposite ends of the top portion to partially cover two opposite lateral surfaces of each of the features, respectively, the cap layer on the first feature being spaced apart from the cap layer on the second feature; forming a sacrificial feature in a recess between the features; forming a sustaining layer to cover the sacrificial feature; and removing the sacrificial feature to form an air gap.

20 Claims, 7 Drawing Sheets

SEMICONDUCTOR DEVICE HAVING METALLIZATION LAYER WITH LOW CAPACITANCE AND METHOD FOR MANUFACTURING THE SAME

BACKGROUND

Moore's law has been a most powerful driving force for the development of microelectronics industry. In terms of energy, metallization layers in a semiconductor device have always accounted for more than half of the capacitance on the semiconductor device, and thus more than 50% of the dynamic power on the semiconductor device is consumed accordingly. Such phenomenon causes a high resistance-capacitance (RC) delay. It is desirable to provide new configuration and/or material in a back-end-of-line (BEOL) process for manufacturing a semiconductor device to reduce the high RC delay. Currently, air gaps have been introduced in the BEOL process because air has a lowest dielectric constant (i.e., having a dielectric constant (a k-value) of 1) so as to reduce the capacitance. A capping layer is generally deposited on metal lines of the metallization layers to be formed before the air gaps are formed. However, the capping layer reduces the volume of air gaps, specifically at metal lines with a denser and smaller pitch, which might cause a relatively high capacitance, and thus result in a relatively high RC delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
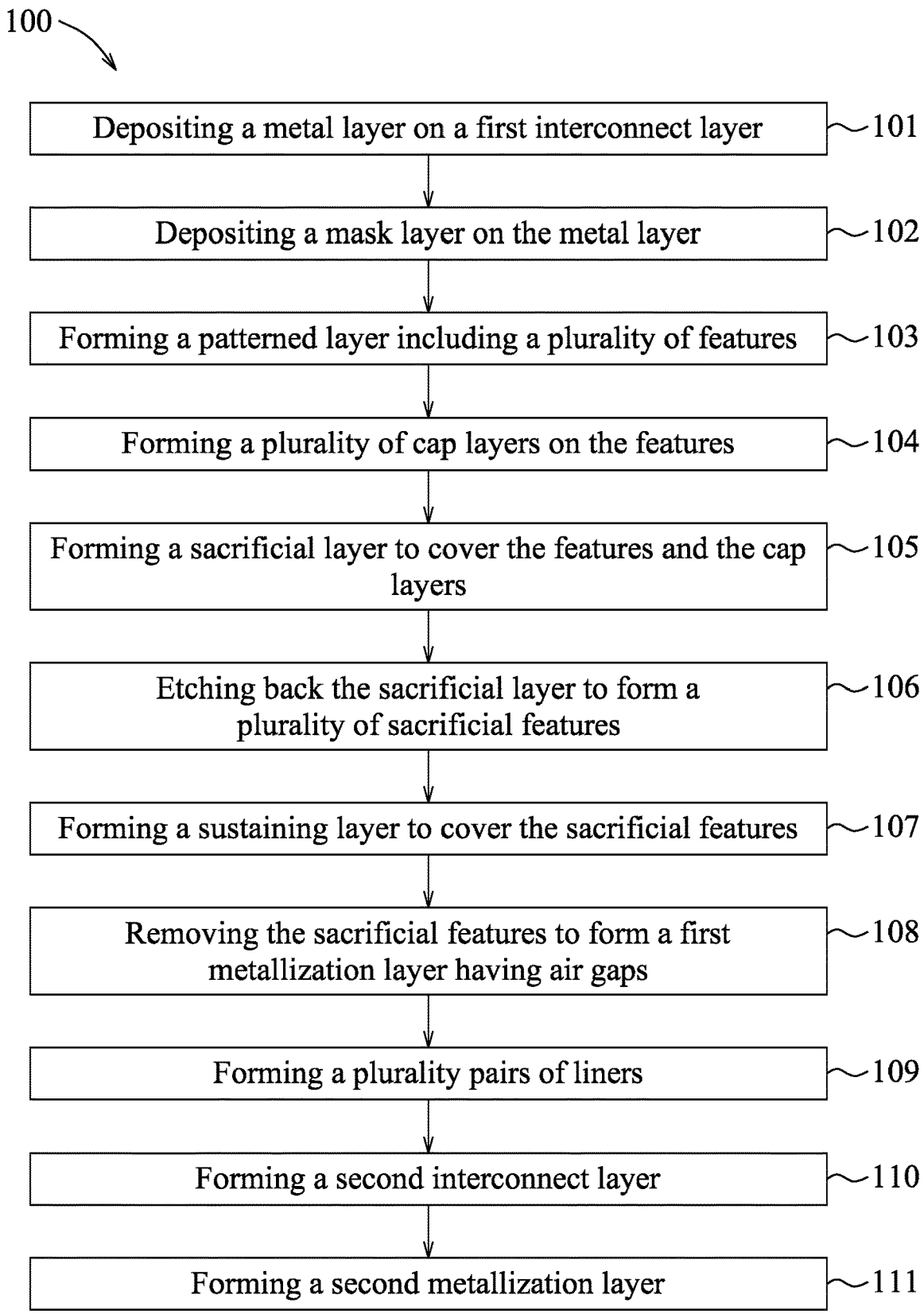
FIG. 1 is a flow diagram illustrating a method for manufacturing a semiconductor device in accordance with some embodiments.
Figure 2:
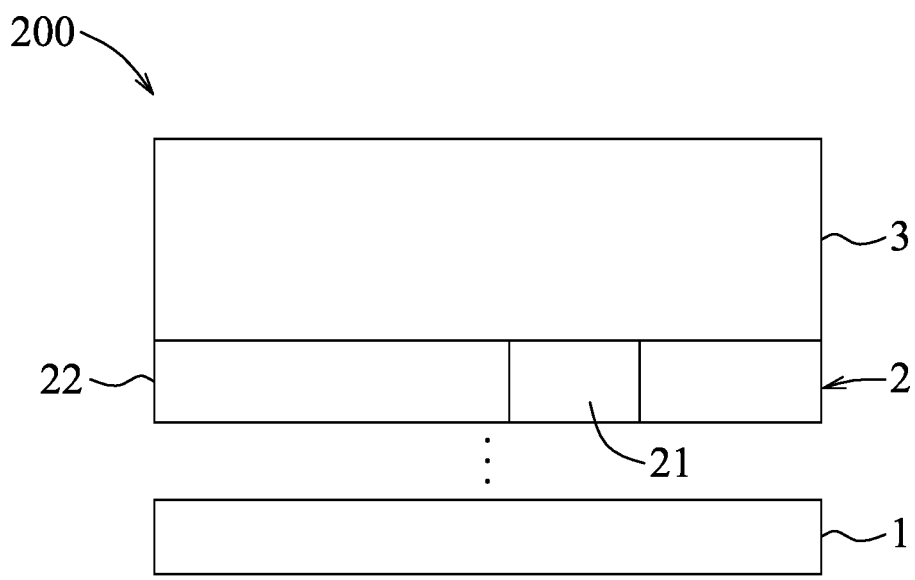
FIGS. 2 to 12 are schematic views illustrating some intermediate stages of the manufacturing method as depicted in FIG. 1 in accordance with some embodiments.
Figure 3:
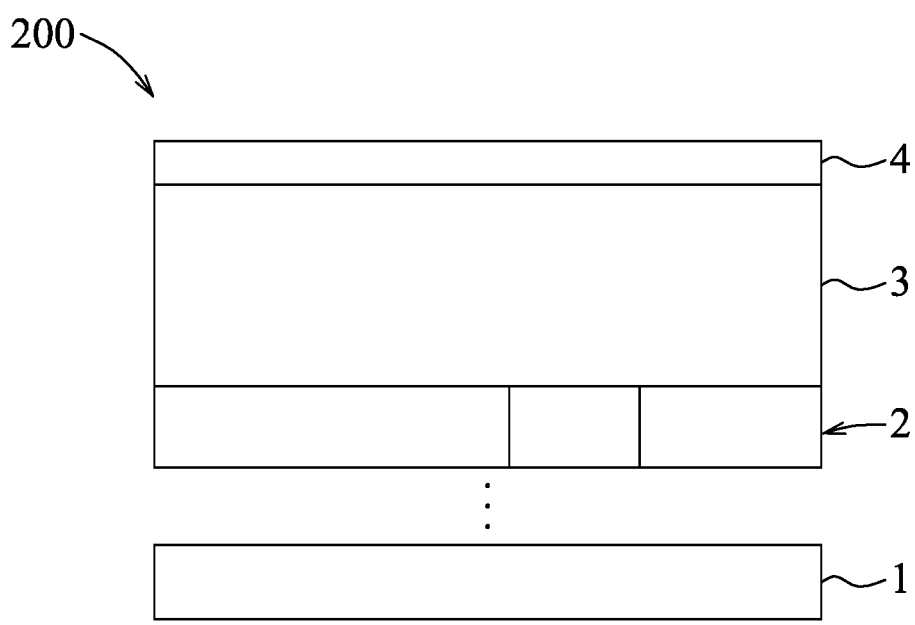
Figure 4:
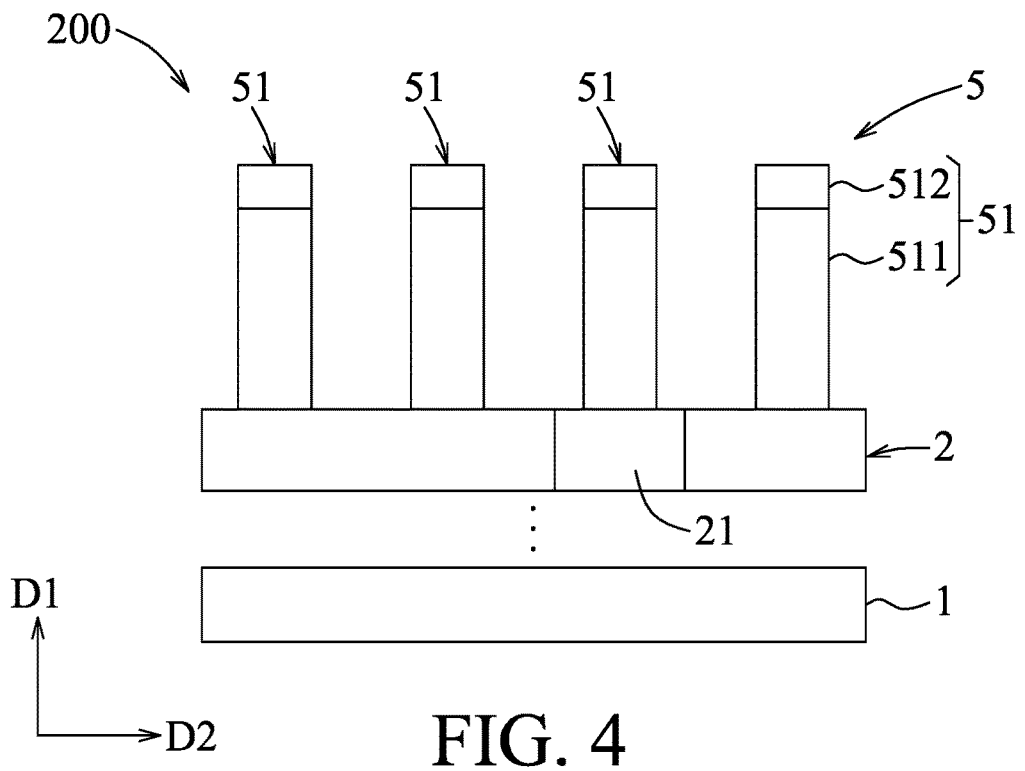

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "upwardly," "horizontal," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for manufacturing a semiconductor device and a semiconductor device obtained by the method. FIG. 1 is a flow diagram illustrating a method 100 for manufacturing a semiconductor device in accordance with some embodiments. FIGS. 2 to 12 illustrate some schematic views of a semiconductor device 200 during various stages of the method 100 shown in FIG. 1. The method 100 and the semiconductor device 200 are collectively described below. However, additional steps can be provided before, after or during the various stages of the method 100, and some of the steps described herein may be replaced by other steps or be eliminated. Similarly, additional features may be present in the semiconductor device 200, and/or the features presented herein may be replaced or eliminated in additional embodiments.

Referring to FIG. 1, the method 100 begins at block 101, where a metal layer is deposited. Referring to the example illustrated in FIG. 2, a metal layer 3 is deposited on a first interconnect layer 2 formed over a substrate 1.

In some embodiments, the substrate 1 may be a semiconductor substrate, e.g., an elemental semiconductor or a compound semiconductor. An elemental semiconductor is composed of single species of atoms, such as silicon (Si), germanium (Ge), or the like in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition thereof changes from one ratio at one location to another ratio at another location in the compound semiconductor. The compound semiconductor may be formed over a silicon substrate. The compound semiconductor may be strained. Alternatively, the substrate 1 may include a non-semiconductor material, such as a glass, fused quartz, calcium fluoride, or the like. Furthermore, in some embodiments, the substrate 1 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or the like, or combinations thereof. The substrate may be doped with a p-type dopant, such as boron (Br), aluminum (Al), gallium (Ga), or the like, or may alternatively be doped with an n-type dopant, as is known in the art. In some embodiments, the substrate 1 may include a doped epitaxial layer. Shallow trench isolation (STI) regions (not shown) may be formed in the substrate 1 to isolate active regions, such as source or drain regions of an integrated circuit device (not shown) in the substrate 1. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 1 for electrically connecting features on opposite sides of the substrate 1.

The first interconnect layer 2 formed with at least one conductive interconnect 21 (for example, a conductive via contact) is formed over the substrate 1. The first interconnect layer 2 includes a dielectric layer 22, and the at least one conductive interconnect 21 extending from a top surface to a bottom surface of the dielectric layer 22. The dielectric layer 22 may be made of a dielectric material, for example, but not limited to, silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (purchased from Applied Materials Inc., Santa Clara, Calif.), Xerogel, Aerogel, polyimide, Parylene, BCB (bis-benzocyclobutenes), Flare, SiLK™ (purchased from Dow Chemical Co., Midland, Mich.), non-porous materials, porous materials, or combinations thereof. In some embodiments, the dielectric layer 22 may include a high density plasma (HDP) dielectric material (e.g., HDP oxide), a high aspect ratio process (HARP) dielectric material (e.g., HARP oxide), or a combination thereof. The at least one conductive interconnect 21 includes an electrically conductive material, for example, but not limited to, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or the like, or alloys thereof. In some embodiments, the electrically conductive material may be provided as multiple layers having varying composition.

The metal layer 3 may be deposited on the first interconnect layer 2 by a suitable deposition process as is known in the art of semiconductor fabrication, for example, but not limited to, physical vapor deposition (PVD), chemical vapor deposition (CVD), atomic layer deposition (ALD), plasma-enhanced CVD (PECVD), plasma-enhanced ALD (PEALD), or the like. In some embodiments, the metal layer 3 is made of an electrically conductive material which may be, for example, but not limited to, Cu, Co, Ru, Mo, Cr, W, Mn, Rh, Ir, Ni, Pd, Pt, Ag, Au, Al, or the like, or alloys thereof. In some embodiments, a glue layer (not shown) may be deposited on the first interconnect layer 2 by a suitable process as is known in the art of semiconductor fabrication, for example, but not limited to, PVD, CVD, ALD, PECVD, PEALD, or the like, before the metal layer 3 is deposited. The glue layer can provide good adhesion to the first interconnect layer 2 and the metal layer 3. In some embodiments, the glue layer includes, for example, but not limited to, a nitride of tantalum (Ta), titanium (Ti), or other suitable metals.

Referring to FIG. 1, the method 100 then proceeds to block 102, where a mask layer is deposited on the metal layer. Referring to the example illustrated in FIG. 3, a mask layer 4 (for example, a hard mask layer) is deposited on the metal layer 3. Examples of a material suitable for forming the mask layer 4 include, for example, but not limited to, silicon oxide, silicon nitride, silicon carbide, silicon oxycarbide, silicon oxynitride, silicon carbonitride, silicon oxycarbonitride, cobalt, ruthenium, tungsten, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. In some embodiments, the mask layer 4 may have a thickness ranging from about 300 Å to about 500 Å. The mask layer 4 may be deposited on the metal layer 3 by a suitable process as is known in the art of semiconductor fabrication, such as PVD, CVD, ALD, PEALD, thermal ALD, PECVD, or the like.

Referring to FIG. 1, the method 100 then proceeds to block 103, where a patterned layer including a plurality of features is formed. Referring to the examples illustrated in FIGS. 3 and 4, the mask layer 4 is patterned using photolithography and photoresist developing technology as is known to those skilled in the art of semiconductor fabrication. For example, a photoresist layer (not shown) is formed on the mask layer 4 by a suitable fabrication technique known to those skilled in the art of semiconductor fabrication, for example, but not limited to, a spin-on technique. The photoresist layer is then patterned using a suitable photolithography technique to form a pattern of through openings. For example, the photoresist layer is exposed to light for patterning, followed by developing to form the pattern of the through openings. The pattern of the through openings formed in the photoresist layer is transferred to the mask layer 4 using a suitable etching process, for example, but not limited to, a wet etching process, a dry etching process, a reactive ion etching (RIE) process, a neutral beam etching process, or the like. After the pattern of the through openings is transferred to the mask layer 4, the photoresist layer may be removed by, for example, but not limited to, an ashing process. The pattern of the through openings formed in the mask layer 4 is then transferred to the metal layer 3 using a suitable etching process, for example, but not limited to, RIE, plasma etching, deep RIE, atomic layer etching, or the like, using an etching gas, for example, but not limited to, $CH_3COOH$, $CH_3OH$, $CH3CH_2OH$, $CH_3F$, $CHF_3$, $CH_2F_2$, $CF_4$, $C_4F_8$, $C_4F_6$, $N_2$, Ar, $O_2$, $NF_3$, $CO_2$, Hz, $Cl_2$, $SiCl_4$, $BCl_3$, or the like, so as to form a patterned layer 5 including a plurality of features 51 which extend upwardly from the first interconnect layer 2 in a normal direction (D1) transverse to the substrate 1 and which are spaced apart from each other in a horizontal direction (D2) transverse to the normal direction (D1). Each of the features 51 includes a conductive portion 511 disposed on the first interconnect layer 2, and a masking portion 512 disposed on the conductive portion 511. At least one of the conductive portions 511 is disposed on the at least one conductive interconnect 21, so as to permit the at least one of the conductive portions 511 to be electrically connected to at least one conductive feature (not shown) disposed below the first interconnect layer 2 through the at least one conductive interconnect 21. In some embodiments, a plurality of the conductive portions 511 are disposed on a plurality of the conductive interconnects 21, respectively, so as to permit the conductive portions 511 to be electrically connected to a plurality of conductive features (not shown) disposed below the first interconnect layer 2 through the conductive interconnects 21, respectively.

In some embodiments, in which the metal layer 3 is patterned by the deep RIE process (for example, an inductive coupled plasma-reactive ion etching (ICP-RIE) process), the following conditions may be used alone or in combinations: (1) transformer coupled plasma (TCP) power: about 100 W to about 1500 W, bias, voltage: about 0 V to about 300 V, and gas: $CH_3COOH$, $CH_3OH$, $CH_3CH_2OH$, or other organic gas, or combinations thereof; (2) TCP power:

about 100 W to about 1500 W, bias, voltage: about 0 V to about 500 V, and gas: $CF_4$, $CHF_3$, $CH_2F_2$, $CH_3F$, $C_4F_8$, $C_4F_6$, $N_2$, $O_2$, Ar, or the like, or combinations thereof; and (3) TCP power: about 100 W to about 2000 W, bias: about 0 V to about 500 V, and gas: $Cl_2$, $SiCl_4$, $BCl_3$, $CF_4$, $CHF_3$, $CH_2F_2$, $CH_3F$, $C_4F_8$, $C_4F_6$, $N_2$, $O_2$, Ar, or the like, or combinations thereof.

Referring to FIG. 1, the method 100 then proceeds to block 104, where a plurality of cap layers are formed on the features of the patterned layer. Referring to the examples illustrated in FIGS. 5 and 6, a plurality of cap layers 6 are respectively formed on upper portions of the features 51 of the patterned layer 5 by a directional deposition process. In the directional deposition process, a dielectric material is directionally deposited upon the features 51 at an inclined angle relative to the normal direction (D1) so as to form the cap layers 6 on the upper portions of the features 51 of the patterned layer 5, respectively. Each of the cap layers 6 includes a top portion 61 disposed on a top surface of each of the features 51 and two opposite wall portions 62 extending downwardly from two opposite ends of the top portion 61 to partially cover two opposite lateral surfaces 513, 514 of each of the features 51, respectively. The cap layers 6 are spaced apart from each other in the horizontal direction (D2). In some embodiments, the dielectric material includes, for example, but not limited to, silicon nitride (SiN), silicon oxide (SiO), silicon carbide (SiC), silicon carbonitride (SiCN), silicon oxynitride (SiON), silicon oxycarbide (SiOC), silicon oxycarbonitride (SiOCN), a low-k dielectric material, or the like, or combinations thereof. In some embodiments, the reactant material used in the directional deposition process for forming the cap layers 6 may include, for example, but not limited to, silane ($SiH_4$), oxygen ($O_2$), tetraethylorthosilicate (TEOS), ammonia ($NH_3$), nitrous oxide ($N_2O$), or the like, or combinations thereof. In some embodiments, the directional deposition process may be performed by PECVD.

Figure 5:
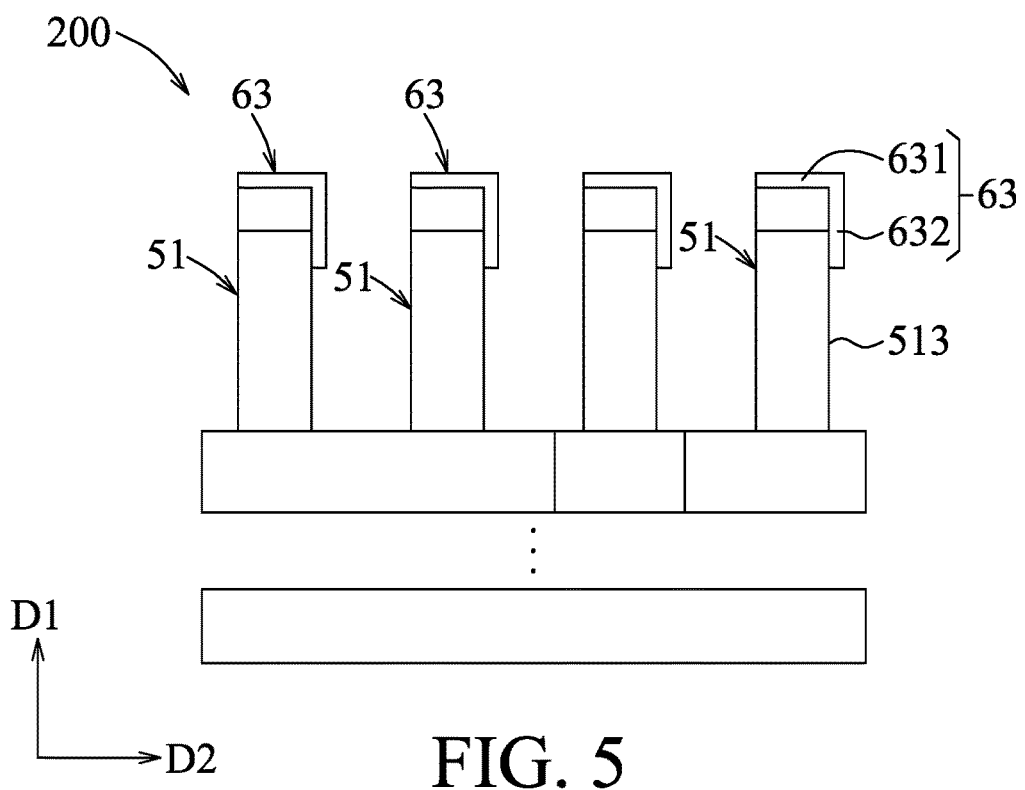
Figure 6:
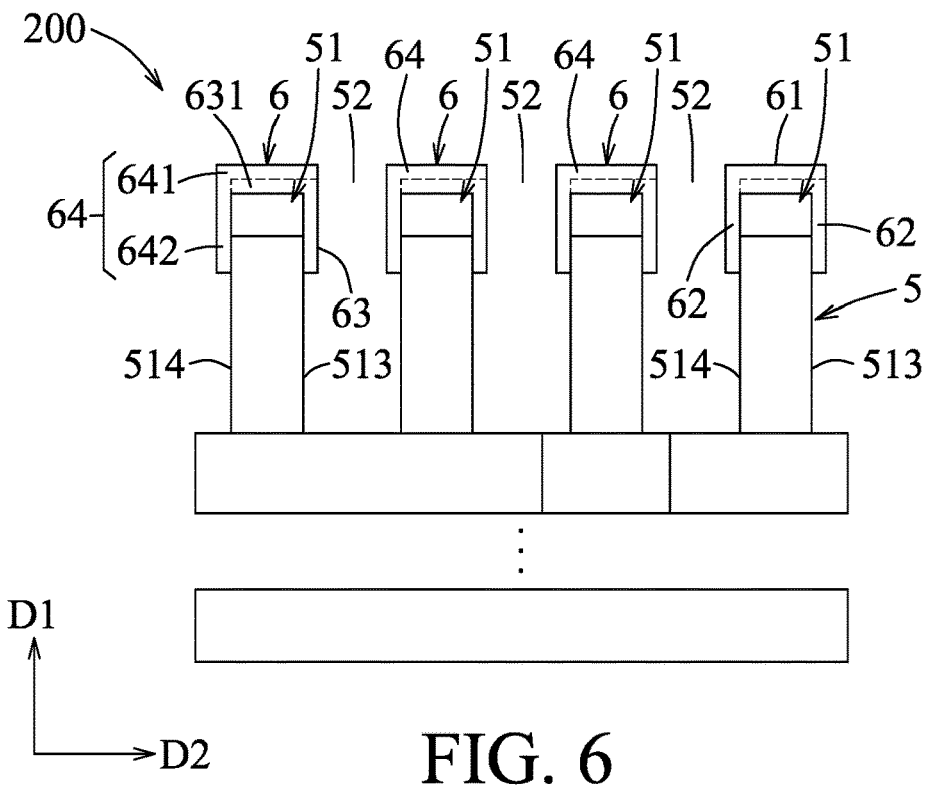
Figure 7:
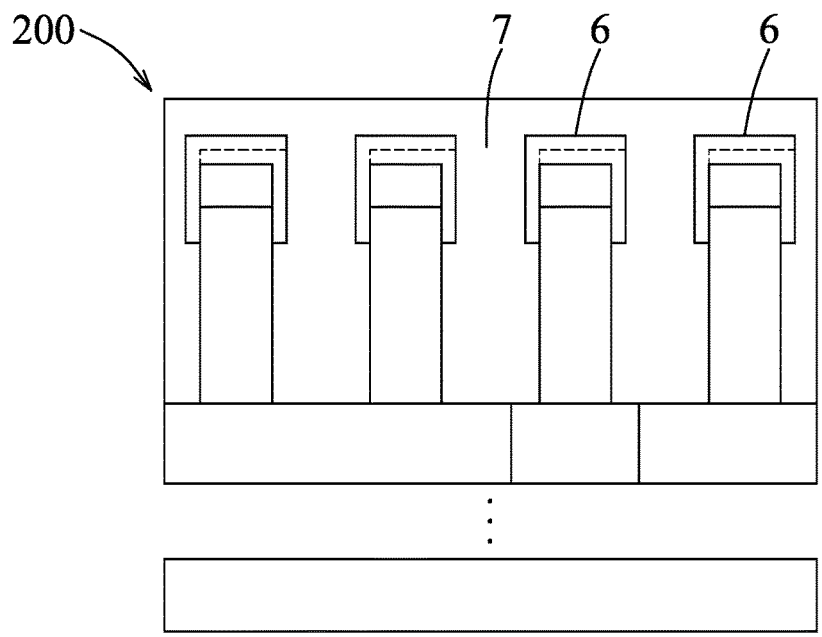
Figure 8:
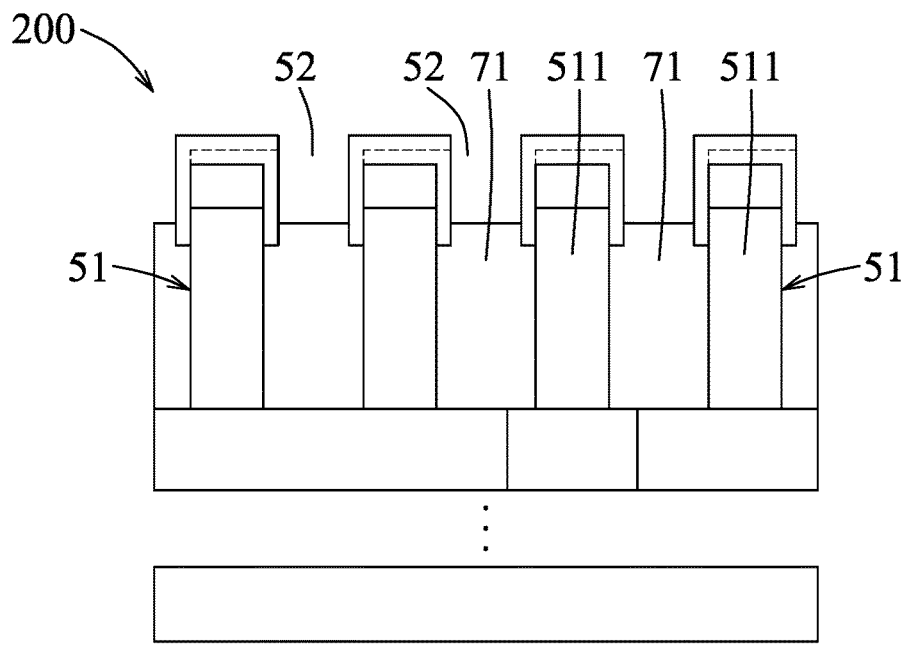
Figure 9:
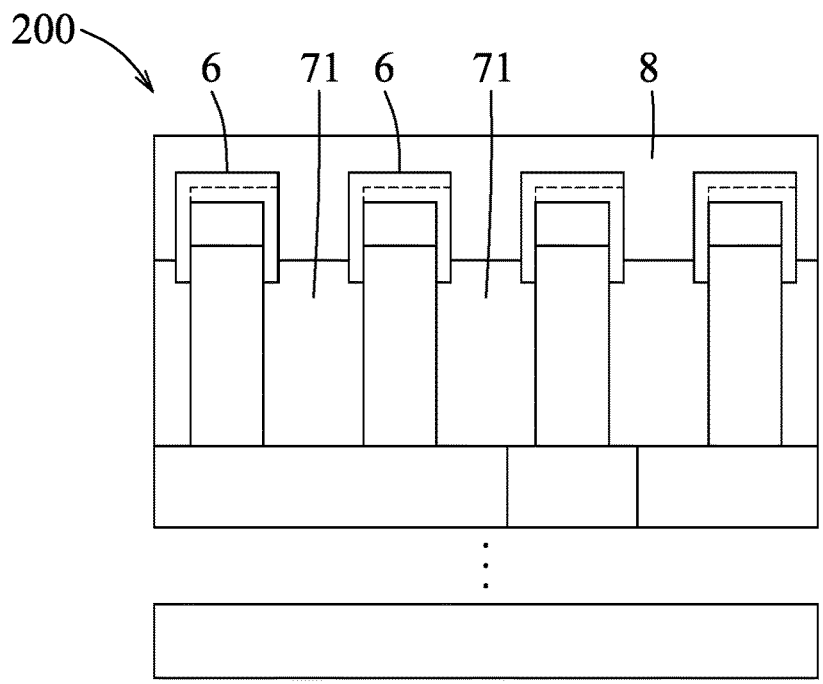
Figure 10:
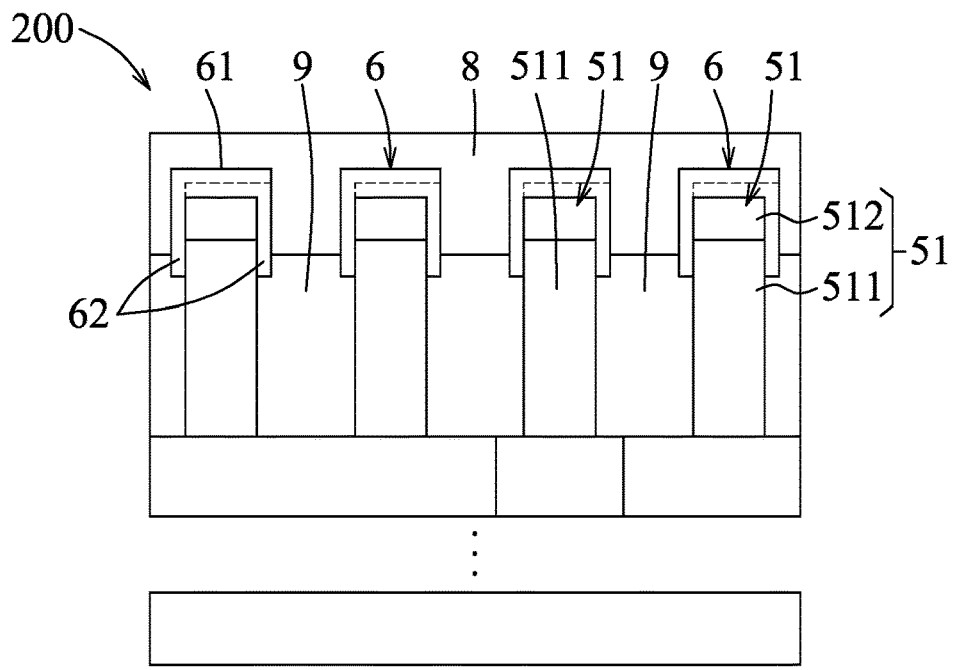

Referring to the example illustrated in FIG. 5, the dielectric material is directionally deposited upon the upper portions of the features 51 at a first orientation relative to the normal direction (D1) so as to form a plurality of first cap portions 63. Each of the first cap portions 63 includes a first top segment 631 disposed on the top surface of each of the features 51, and a first wall segment 632 extending downwardly from an end of the first top segment 631 to partially cover a first lateral surface 513 of each of the features 51. Referring to the example illustrated in FIG. 6, the dielectric material is further directionally deposited upon the upper portions of the features 51 at a second orientation counter to the first orientation relative to the normal direction (D1) so as to form a plurality of second cap portions 64. Each of the second cap portions 64 includes a second top segment 641 disposed on the first top segment 631 of each of the first cap portions 63, and a second wall segment 642 extending downwardly from an end of the second top segment 641 to partially cover a second lateral surface 514 of each of the features 51. Each of the second cap portions 64 cooperates with a corresponding one of the first cap portions 63 to form one of the cap layers 6.

In some embodiments, the directional deposition process may be performed in a PECVD apparatus in which a plasma used for performing PECVD is generated by ionizing the reactant material using an electrode installed in the PECVD apparatus. The directional deposition performed on the example illustrated in FIG. 5 or the example illustrated in FIG. 6 may be achieved by inclining the direction of the plasma away from the normal direction (D1) or inclining the features 51 (i.e., inclining the substrate 1) such that the normal direction (D1) is away from the direction of the plasma.

In some embodiments, inclining the direction of the plasma includes inclining the source of the plasma. In some embodiments, inclining the source of the plasma includes adjusting the position of a dispenser installed on the PECVD apparatus which is used for dispensing the reactant material into a chamber of the PECVD apparatus, such that the direction along which the reactant material enters the chamber forms an angle with respect to the normal direction (D1). In some embodiments, the direction of the plasma may be changed by inclining the electrode that is used for generating the plasma. In some embodiments, the direction of the plasma may be changed by adjusting the strength of an electric or magnetic field that is used for generating the plasma. In some embodiments, an inclining angle for performing the directional deposition may be greater than about 0 degree but less than about 90 degrees. In some embodiments, the inclining angle may be determined based on factors such as the heights and/or pitches of the features 51.

In some embodiments, the height of each of the wall portions 62 of the cap layers 6 is determined based on factors such as the inclining angle of the direction of the plasma with respect to the normal direction (D1) and the heights and/or pitches of the features 51.

Referring to FIG. 1, the method 100 then proceeds to block 105, where a sacrificial layer is formed to cover the features and the cap layers. Referring to the examples illustrated in FIGS. 6 and 7, a sacrificial material is filled into recesses 52 formed among the features 51 so as to form a sacrificial layer 7. The sacrificial material may be filled into the recesses 52 by a suitable method as is known to those skilled in the art of semiconductor fabrication, for example, but not limited to, ALD, CVD, molecular layer deposition (MLD), PECVD, PEALD, spin-on deposition, or the like. A top surface of the sacrificial layer 7 thus formed may be higher or lower than top surfaces of the cap layers 6.

In some embodiments, the sacrificial material is a sacrificial polymer, which may be degraded by a treatment, for example, an annealing treatment, a plasma treatment, an ultraviolet treatment, or the like, or combinations thereof. Examples of the sacrificial polymer include, for example, but not limited to, polyurea, polylactic acid, polycaprolactone, poly(methyl methacrylate), poly(ethylene oxide), and combinations thereof.

Referring to FIG. 1, the method 100 then proceeds to block 106, where the sacrificial layer is etched back to form a plurality of sacrificial features. Referring to the example illustrated in FIGS. 7 and 8, the sacrificial layer 7 is etched back by an anisotropic etching process until sacrificial features 71 each having a height less than a height of the conductive portion 511 of each of the features 51 is formed in the recesses 52. The anisotropic etching process may be any suitable anisotropic etching process as is known to those skilled in the art of semiconductor fabrication, for example, but not limited to, an anisotropic dry etching process. In some embodiments, the anisotropic dry etching process may be performed using an oxygen-containing gas, a fluorine-containing gas (for example, but not limited to, $CF_4$, $SF_6$, $CH_2F_2$, $CHF_3$, $C_2F_6$, or the like, or combinations thereof), a chlorine-containing gas (for example, but not limited to, $Cl_2$, $CHCl_3$, $CCl_4$, $BCl_3$, or the like, or combinations thereof), a bromine-containing gas (for example, but not limited to, HBr, $CHBr_3$, or the like, or combinations thereof), an iodine-containing gas, other suitable gas and/or plasma, or combinations thereof. The height of the sacrificial features 71 may be controlled by adjusting the etching time period during the anisotropic etching.

Referring to FIG. 1, the method 100 then proceeds to block 107, where a sustaining layer is formed to cover the sacrificial features. Referring to the example illustrated in FIG. 9, a low-k dielectric material is deposited on the cap layers 6 and the sacrificial features 71 to form a sustaining layer 8 which has a loose structure and which covers the sacrificial features 71. In some embodiments, the sustaining layer 8 has a porous structure. The deposition of the low-k dielectric material for forming the sustaining layer 8 may be performed by a suitable deposition process as is known to those skilled in the art of semiconductor fabrication, for example, but not limited to, ALD, CVD, PEALD, PECVD, or the like. Examples of the low-k dielectric material suitable for forming the sustaining layer 8 include, for example, but not limited to, silicon oxide, silicon nitride, silicon carbide, silicon oxycarbide, silicon oxynitride, silicon carbonitride, silicon oxycarbonitride, and combinations thereof.

Referring to FIG. 1, the method 100 then proceeds to block 108, where the sacrificial features are removed to form air gaps. Referring to the examples illustrated in FIGS. 9 and 10, the sacrificial features 71 are removed by diffusing through the porous structure formed in the sustaining layer 8, so as to obtain the semiconductor structure 200 having air gaps 9 which are confined by the sustaining layer 8 and the features 51. In some embodiments, the sacrificial features 71 may be removed by the aforesaid treatment, for example, the annealing treatment, the plasma treatment, the ultraviolet treatment, or the like, or combinations thereof. In some embodiments, the sacrificial features 71 may be removed by the annealing treatment at a suitable temperature so as to permit the sacrificial features 71 to vaporize and to degas through the sustaining layer 8. Some ash may be produced after the annealing treatment, the plasma treatment, or the ultraviolet treatment, and remains in the air gaps 9. Each of the air gaps 9 thus formed in the semiconductor structure 200 has a height which is less than a height of the conductive portion 511 of each of the features 51.

Referring to FIG. 1, the method 100 then proceeds to block 109, where a plurality pairs of liners are formed. Referring to the examples illustrated in FIGS. 10 and 11, a suitable planarization process, for example, but not limited to, chemical mechanical planarization (CMP) is performed to remove an upper part of the sustaining layer 8, upper parts of the cap layers 6, and upper parts of the features 51 to form a plurality pairs of lines 65 and a plurality of sustaining covers 81, so as to form a first metallization layer (Mx). The masking portions 512 are removed such that the conductive portions 511 remain as conductive features after performing the planarization process to remove the upper parts of the features 51. A patterned conductive layer including a plurality of the conductive features 511 is formed accordingly. Lower parts of the wall portions 62 of the cap layers 6 on the features 51 remain after performing the planarization process to remove the upper parts of the cap layers 6 so as to form the plurality pairs of the liners 65. Each pair of the liners 65 cover upper portions of the two opposite lateral surfaces 513', 514' of a corresponding one of the conductive portions (i.e., the conductive features) 511. A lower part of the sustaining layer 8 remains after performing the planarization process to remove the upper part of the sustaining layer 8 so as to form the sustaining covers 81. Each of the sustaining covers 81 is disposed to interconnect one of a pair of the liners 65 and one of an adjacent pair of the liners 65 adjacent to the one of the pair of liners 65 so as to form a corresponding one of the air gaps 9 confined by corresponding two of the conductive features 511, the one of the pair of the liners 65, the one of the adjacent pair of the liners 65, and a corresponding one of the sustaining covers 81. In some embodiments, each of the liners 65 has a thickness ranging from about 1 nm to about 4 nm. In some embodiments, each of the sustaining covers 81 has a thickness ranging from about 5 nm to the length of one of the liners 65.

Figure 11:
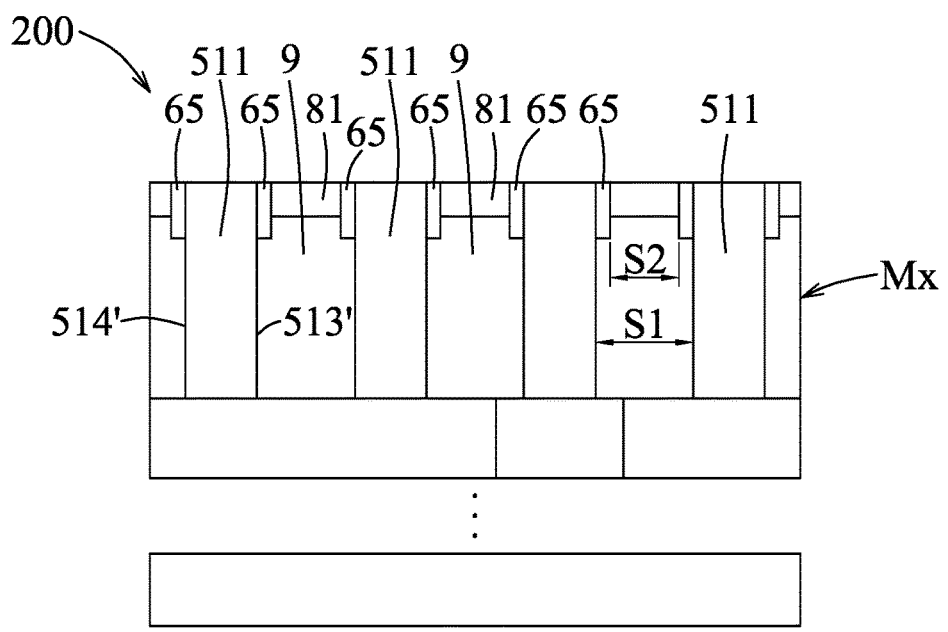
Figure 12:
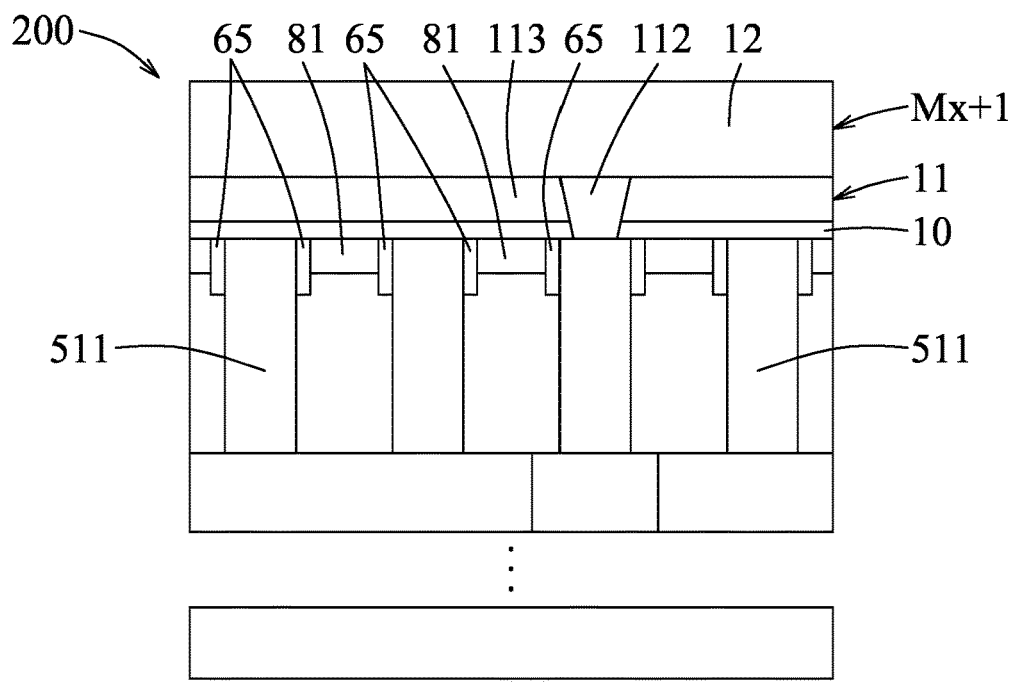

Referring to the example illustrated in FIG. 11, a spacing distance (S1) between two adjacent ones of the conductive features 511 is larger than a spacing distance (S2) between two adjacent ones of the liners 65 laterally covering upper portions of the two adjacent ones of the conductive features 511, respectively, by a distance which is equal to a total thickness of the two adjacent ones of the liners 65. In some embodiments, the spacing distance (S1) is larger than the spacing distance (S2) by a distance ranging from about 2 nm to about 8 nm.

In some embodiments, each of the liners 65 extends downwardly from a top surface of a corresponding one of the conductive features 511 by a length ranging from one-third to one-half of a height of the corresponding one of the conductive feature 511. In some embodiments, each of the liners 65 extends downwardly from the top surface of the corresponding one of the conductive features 511 by a length ranging from 10 nm to 15 nm.

Referring to FIG. 1, the method 100 then proceeds to block 110, where a second interconnect layer is formed, and block 111, where a second metallization layer is formed. Referring to the example illustrated in FIG. 12, an etch stop layer (ESL) 10 is formed on the sustaining covers 81, the liners 65, and the conductive features 511. The ESL 10 may be formed by a suitable deposition process known to those skilled in the art of semiconductor fabrication, for example, but not limited to, CVD, PECVD, ALD, PEALD, or the like. Materials suitable for forming the ESL 10 may include, for example, but not limited to, aluminum compounds (for example, aluminum nitride, aluminum oxynitride, aluminum oxide, etc.), silicon compounds (for example, silicon oxycarbide, silicon carbonitride, silicon nitride, silicon oxycarbonitride, silicon oxide, silicon carbide, silicon oxynitride, etc.), or the like, or combinations thereof.

An interlayer dielectric (ILD) layer 113 is deposited on the ESL 10 by a suitable deposition process known to those skilled in the art of semiconductor fabrication, for example, but not limited to, CVD, ALD, PECVD, PEALD, or like. The ILD layer 113 may include a dielectric material, for example, but not limited to, silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (purchased from Applied Materials Inc., Santa Clara, Calif.), Xerogel, Aerogel, polyimide, Parylene, BCB (bis-benzocyclobutenes), Flare, SiLK™ (purchased from Dow Chemical Co., Midland, Mich.), non-porous materials, porous materials, or combinations thereof. In some embodiments, the ILD layer 113 may include a high density plasma (HDP) dielectric material (e.g., HDP oxide), a high aspect ratio process (HARP) dielectric material (e.g., HARP oxide), or a combination thereof. At least one conductive interconnect structure (for example, a conductive via contact) 112 is formed in the ILD layer 113 to obtain a second interconnect layer 11. The at least one conductive interconnect structure 112 penetrates through the ILD layer 113 and the ESL 10 so as to be electrically connected to the at least one of the conductive features 511. In some embodiments, a plurality of the conductive interconnect structures 112 penetrate through the ILD layer 113 and the ESL 10 so as to be electrically connected to a plurality of the conductive features 511, respectively. In some embodiments, formation of the at least one conductive interconnect structure 112 includes the following steps. First, at least one via opening is formed through the ILD layer 113 and the ESL 10 to expose at least one of the conductive features 511 from the at least one via opening. After formation of the at least one via opening, the at least one conductive interconnect structure 112 is formed by depositing a metal material to fill the at least one via opening and then removing excess of the metal material by a planarization technique, such as CMP. In some embodiments, the metal material may include, for example, but not limited to, Cu, Co, Ru, Mo, Cr, W, Mn, Rh, Ir, Ni, Pd, Pt, Ag, Au, Al, or alloys thereof. In some embodiments, deposition of the metal material for forming the conductive interconnect structure 112 may be performed by a suitable technique known to those skilled in the art of semiconductor fabrication, for example, but not limited to, PVD, CVD, PECVD, ALD, PEALD, or other suitable deposition techniques.

A second metallization layer (Mx+1) is formed on the second interconnect layer 11. The formation of the second metallization layer (Mx+1) includes the following steps. First, a dielectric layer is deposited on the second interconnect layer 11, and then a plurality of recesses are formed through the dielectric layer. After formation of the recesses, a plurality of metal lines 12 are formed by depositing a metal material to fill the recesses and then excess of the metal material above the dielectric layer is removed by a planarization technique, such as CMP. In some embodiments, the dielectric layer of the second metallization layer (Mx+1) includes, for example, but not limited to, silicon oxide, silicon nitride, silicon oxynitride, spin-on glass (SOG), amorphous fluorinated carbon, fluorinated silica glass (FSG), carbon doped silicon oxide (e.g., SiCOH), Black Diamond® (purchased from Applied Materials Inc., Santa Clara, Calif.), Xerogel, Aerogel, polyimide, Parylene, BCB (bis-benzocyclobutenes), Flare, SiLK™ (purchased from Dow Chemical Co., Midland, Mich.), non-porous materials, porous materials, or combinations thereof. In some embodiments, the dielectric layer of the second metallization layer (Mx+1) may include, for example, but not limited to, a high density plasma (HDP) dielectric material (e.g., HDP oxide), a high aspect ratio process (HARP) dielectric material (e.g., HARP oxide), or a combination thereof. In some embodiments, the metal material for forming the metal lines 12 may include, for example, but not limited to, Cu, Co, Ru, Mo, Cr, W, Mn, Rh, Ir, Ni, Pd, Pt, Ag, Au, Al, or alloys thereof. In some embodiments, deposition of the metal material for forming the metal lines 12 of the second metallization layer (Mx+1) may be conducted by a suitable technique known to those skilled in the art of semiconductor fabrication, for example, but not limited to, PVD, CVD, PECVD, ALD, PEALD, or other suitable deposition techniques. At least one of the metal lines 12 of the second metallization layer (Mx+1) is electrically connected to at least one of the conductive features 511 through the at least one connective interconnect structure 112 of the second interconnect layer 11. In some embodiments, a plurality of the metal lines 12 of the second metallization layer (Mx+1) are electrically connected to a plurality of the conductive features 511 through a plurality of the connective interconnect structure 112 of the second interconnect layer 11, respectively.

Figure 13:
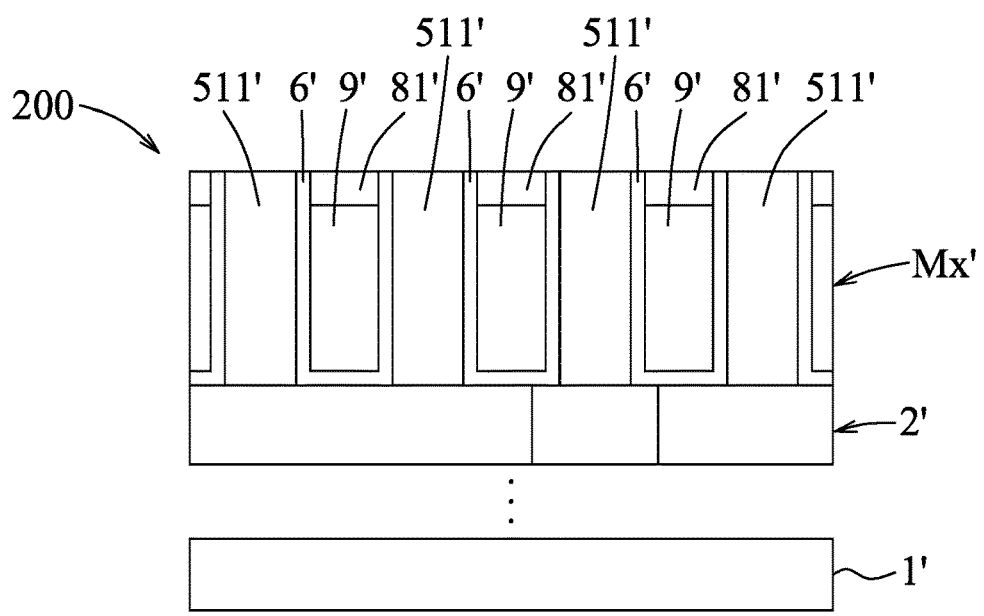
FIG. 13 is a schematic view illustrating a semiconductor device in which capping layers are conformally deposited on entire lateral surfaces of conductive features of a metallization layer.

FIG. 13 illustrates a semiconductor device 200' that includes a substrate 1', an interconnect layer 2', and a metallization layer (Mx'). The substrate 1' is configured to be the same as the substrate 1 of the semiconductor device 200 described above. The interconnect layer 2' is configured to be the same as the first interconnect layer 2 of the semiconductor device 200 described above. The metallization layer (Mx') is configured to be similar to the first metallization layer (Mx) of the semiconductor device 200 described above except that in the metallization layer (Mx'), capping layers 6' are conformally deposited on entire lateral surfaces of conductive features 511' of the metallization layer (Mx') and portions of a top surface of the interconnect layer 2'. Air gaps 9' formed in the semiconductor device 200' are confined by the capping layers 6' and a plurality of sustaining covers 81'. The sustaining covers 81' are configured to be the same as the sustaining covers 81 of the semiconductor device 200 described above.

In comparison with each of the air gaps 9' formed in the semiconductor device 200', each of the air gaps 9 formed in the semiconductor device 200 in accordance with the disclosure has an increased volume because each of the liners 65 extends downwardly from the top surface of a corresponding one of the conductive features 511 merely by a length ranging from one-third to one-half of a height of the corresponding one of the conductive feature 511, and a top surface of the first interconnect layer 2 is not formed with the liners 65 thereon. Therefore, the capacitance of the first metallization layer (Mx) can be reduced so that RC delay can be reduced. The semiconductor device 200 in accordance with the disclosure is more effective in applications in which metal lines with a denser and smaller pitch are desirable.

In accordance with some embodiments of the present disclosure, a method for manufacturing a semiconductor device includes: forming a patterned layer over a substrate, the patterned layer including a first feature and a second feature which extend upwardly in a normal direction transverse to the substrate and which are spaced apart from each other; directionally depositing a dielectric material upon the first and second features at an inclined angle relative to the normal direction so as to form a cap layer on each of the first and second features, the cap layer including a top portion disposed on a top surface of each of the first and second features, and two opposite wall portions extending downwardly from two opposite ends of the top portion to partially cover two opposite lateral surfaces of each of the first and second features, respectively, the cap layer on the first feature being spaced apart from the cap layer on the second feature; forming a sacrificial feature in a recess between the first and second features; forming a sustaining layer to cover the sacrificial feature; and removing the sacrificial feature to form an air gap confined by the sustaining layer and the first and second features.

In accordance with some embodiments of the present disclosure, directionally depositing the dielectric material includes: directionally depositing the dielectric material upon the first and second features at a first orientation relative to the normal direction so as to form a first cap portion including a first top segment disposed on the top surface of each of the first and second features, and a first wall segment extending downwardly from an end of the first top segment to partially cover a first lateral surface of each of the first and second features; and directionally depositing the dielectric material upon the first and second features at a second orientation counter to the first orientation relative to the normal direction so as to form a second cap portion including a second top segment disposed on the first top segment, and a second wall segment extending downwardly from an end of the second top segment to partially cover a second lateral surface of each of the first and second features opposite to the first lateral surface.

In accordance with some embodiments of the present disclosure, the dielectric material is directionally deposited by plasma-enhanced chemical vapor deposition.

In accordance with some embodiments of the present disclosure, the method for manufacturing a semiconductor device further includes: removing an upper part of the sustaining layer, an upper part of the cap layer, and upper parts of the first and second features to form a first liner, a second liner, and a sustaining cover disposed to interconnect the first and second liners so as to cover the air gap. The first liner covers an upper portion of a lateral surface of a remaining part of the first feature, the second liner covers an upper portion of a lateral surface of a remaining part of the second feature facing the lateral surface of the remaining part of the first feature.

In accordance with some embodiments of the present disclosure, the first feature includes a first conductive portion and a first masking portion disposed on the first conductive portion. The second feature includes a second conductive portion and a second masking portion disposed on the second conductive portion. The first and second masking portions are removed such that the first and second conductive portions remain after removing the upper parts of the first and second features. Lower parts of the wall portions of the cap layer on the first feature remain after removing the upper part of the cap layer, so as to form a pair of the first liners covering upper portions of two opposite lateral surfaces of the first conductive portion, respectively. Lower parts of the wall portions of the cap layer on the second feature remain after removing the upper part of the cap layer, so as to form a pair of the second liners covering upper portions of two opposite lateral surfaces of the second conductive portion, respectively. A lower part of the sustaining layer remains after removing the upper part of the sustaining layer, so as to form the sustaining cover.

In accordance with some embodiments of the present disclosure, forming the sacrificial feature includes: filling a sacrificial material into the recess; and etching back the sacrificial material until the sacrificial feature having a height less than a height of each of the first and second conductive portions is formed in the recess.

In accordance with some embodiments of the present disclosure, the sacrificial feature is removed by a treatment selected from an annealing treatment, a plasma treatment, an ultraviolet treatment, or combinations thereof.

In accordance with some embodiments of the present disclosure, a semiconductor device includes a substrate, a patterned conductive layer, a first liner, a second liner, and a sustaining cover. The patterned conductive layer is disposed over the substrate, and includes a first conductive feature and a second conductive feature spaced apart from each other. The first liner covers an upper portion of a lateral surface of the first conductive feature. The second liner covers an upper portion of a lateral surface of the second conductive feature facing the lateral surface of the first conductive feature. The sustaining cover is disposed to interconnect the first liner and the second liner so as to form an air gap confined by the first and second conductive features, the first and second liners, and the sustaining cover.

In accordance with some embodiments of the present disclosure, a spacing distance between the first and second conductive features is larger than a spacing distance between the first and second liners by a distance which is equal to a total thickness of the first and second liners.

In accordance with some embodiments of the present disclosure, each of the first and second liners independently has a thickness ranging from 1 nm to 4 nm.

In accordance with some embodiments of the present disclosure, the first liner extends downwardly from a top surface of the first conductive feature by a length ranging from one-third to one-half of a height of the first conductive feature.

In accordance with some embodiments of the present disclosure, the second liner extends downwardly from a top surface of the second conductive feature by a length ranging from one-third to one-half of a height of the second conductive feature.

In accordance with some embodiments of the present disclosure, the first and second liners independently extend downwardly from top surfaces of the first and second conductive features, respectively, by a length ranging from 10 nm to 15 nm.

In accordance with some embodiments of the present disclosure, the sustaining cover has a thickness ranging from 5 nm to the length of each of the first and second liners.

In accordance with some embodiments of the present disclosure, the sustaining cover is made of a low-k porous material selected from silicon oxide, silicon oxycarbide, silicon oxynitride, silicon carbonitride, silicon oxycarbonitride, or combinations thereof.

In accordance with some embodiments of the present disclosure, the first and second liners are made of a dielectric material selected from silicon nitride, silicon oxide, silicon carbide, silicon carbonitride, silicon oxynitride, silicon oxycarbide, silicon oxycarbonitride, or combinations thereof.

In accordance with some embodiments of the present disclosure, a semiconductor device includes a substrate, a patterned conductive layer, a pair of first liners, a pair of second liners, and a sustaining cover. The patterned conductive layer is disposed over the substrate, and includes a first conductive feature and a second conductive feature spaced apart from each other. The pair of the first liners respectively cover upper portions of two opposite lateral surfaces of the first conductive feature. The pair of the second liners respectively cover upper portions of two opposite lateral surfaces of the second conductive feature. The sustaining cover is disposed to interconnect one of the first liners and one of the second liners adjacent to the one of the first liners so as to form an air gap confined by the first and second conductive features, the one of the first liners, the one of the second liners, and the sustaining cover.

In accordance with some embodiments of the present disclosure, a spacing distance between the first and second conductive features is larger than a spacing distance between the one of the first liners and the one of the second liners by a distance which is equal to a total thickness of the one of the first liners and the one of the second liners.

In accordance with some embodiments of the present disclosure, each of the one of the first liners and the one of the second liners independently has a thickness ranging from 1 nm to 4 nm.

In accordance with some embodiments of the present disclosure, the one of the first liners extends downwardly from a top surface of the first conductive feature by a length ranging from one-third to one-half of a height of the first conductive feature. The one of the second liners extends downwardly from a top surface of the second conductive feature by a length ranging from one-third to one-half of a height of the second conductive feature.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a patterned layer over a substrate, the patterned layer including a first feature and a second feature which extend upwardly in a normal direction transverse to the substrate and which are spaced apart from each other by a recess;
    directionally depositing a dielectric material upon the first feature and the second feature at an inclined angle relative to the normal direction so as to form a cap layer on each of the first feature and the second feature, the cap layer including a top portion disposed on a top surface of each of the first feature and the second feature, and two opposite wall portions extending downwardly from two opposite ends of the top portion to partially cover two opposite lateral surfaces of each of the first feature and the second feature such that a lower portion of each of the first feature and the second feature is exposed from the cap layer to the recess, the cap layer on the first feature being disconnected from the cap layer on the second feature;
    forming a sacrificial feature in the recess between the first feature and the second feature;
    forming a sustaining layer to cover the sacrificial feature; and
    removing the sacrificial feature to form an air gap confined by the sustaining layer and the first feature and the second feature.

2. The method according to claim 1, wherein directionally depositing the dielectric material includes:
    directionally depositing the dielectric material upon the first feature and the second feature at a first orientation relative to the normal direction so as to form a first cap portion including a first top segment disposed on the top surface of each of the first feature and the second feature, and a first wall segment extending downwardly from an end of the first top segment to partially cover a first lateral surface of each of the first feature and the second feature; and
    directionally depositing the dielectric material upon the first feature and the second feature at a second orientation counter to the first orientation relative to the normal direction so as to form a second cap portion including a second top segment disposed on the first top segment, and a second wall segment extending downwardly from an end of the second top segment to partially cover a second lateral surface of each of the first feature and the second feature opposite to the first lateral surface.

3. The method according to claim 1, wherein the dielectric material is directionally deposited by plasma-enhanced chemical vapor deposition.

4. The method according to claim 1, further comprising: removing an upper part of the sustaining layer, an upper part of the cap layer, and upper parts of the first feature and the second feature to form a first liner, a second liner, and a sustaining cover disposed to interconnect the first liner and the second liner so as to cover the air gap, the first liner covering an upper portion of a lateral surface of a remaining part of the first feature, the second liner covering an upper portion of a lateral surface of a remaining part of the second feature facing the lateral surface of the remaining part of the first feature.

5. The method according to claim 4, wherein
    the first feature includes a first conductive portion and a first masking portion disposed on the first conductive portion;
    the second feature includes a second conductive portion and a second masking portion disposed on the second conductive portion;
    the first masking portion and the second masking portion are removed such that the first conductive portion and the second conductive portion remain after removing the upper parts of the first feature and the second feature;
    lower parts of the two opposite wall portions of the cap layer on the first feature remain after removing the upper part of the cap layer, so as to form a pair of the first liners covering upper portions of two opposite lateral surfaces of the first conductive portion, respectively;
    lower parts of the two opposite wall portions of the cap layer on the second feature remain after removing the upper part of the cap layer, so as to form a pair of the second liners covering upper portions of two opposite lateral surfaces of the second conductive portion, respectively; and
    a lower part of the sustaining layer remains after removing the upper part of the sustaining layer, so as to form the sustaining cover.

6. The method according to claim 1, wherein the inclined angle is greater than 0 degrees and less than 90 degrees.

7. The method according to claim 2, wherein the first cap portion is formed such that a second lateral surface of each of the first feature and the second feature opposite to the first lateral surface is uncovered by the first wall segment of the first cap portion and is exposed to the recess.

8. A method for manufacturing a semiconductor device, comprising:
    forming a patterned layer over a substrate, the patterned layer including a first feature and a second feature which extend upwardly in a normal direction transverse to the substrate and which are spaced apart from each other by a recess; and
    directionally depositing a dielectric material upon the first feature and the second feature at an inclined angle relative to the normal direction so as to form a cap layer on each of the first feature and the second feature, the cap layer including a top portion disposed on a top surface of each of the first feature and the second feature, and two opposite wall portions extending downwardly from two opposite ends of the top portion to cover upper portions of two opposite lateral surfaces of each of the first feature and the second feature such that a lower portion of each of the first feature and the second feature is exposed from the cap layer to the recess, the cap layer on the first feature being disconnected from the cap layer on the second feature.

9. The method according to claim 8, further comprising:
    forming a sacrificial feature in the recess between the first feature and the second feature, the sacrificial feature having a height less than a height of each of the first feature and the second feature;
forming a sustaining layer to cover the sacrificial feature; and
removing the sacrificial feature to form an air gap confined by the sustaining layer and the first feature and the second feature.

10. The method according to claim 8, wherein directionally depositing the dielectric material includes:
directionally depositing the dielectric material upon the first feature and the second feature at a first orientation relative to the normal direction and at the inclined angle of greater than 0 degrees and less than 90 degrees, so as to form a first cap portion including a first top segment disposed on the top surface of each of the first feature and the second feature, and a first wall segment extending downwardly from an end of the first top segment to cover an upper portion of a first lateral surface of each of the first feature and the second feature; and
directionally depositing the dielectric material upon the first feature and the second feature at a second orientation counter to the first orientation relative to the normal direction and at the inclined angle of greater than 0 degrees and less than 90 degrees, so as to form a second cap portion including a second top segment disposed on the first top segment, and a second wall segment extending downwardly from an end of the second top segment to cover an upper portion of a second lateral surface of each of the first feature and the second feature opposite to the first lateral surface.

11. The method according to claim 10, wherein the first cap portion cooperates with the second cap portion to form the cap layer.

12. The method according to claim 9, wherein
the first feature includes a first conductive portion and a first masking portion disposed on the first conductive portion;
the second feature includes a second conductive portion and a second masking portion disposed on the second conductive portion; and
the method further comprises: removing an upper part of the sustaining layer, an upper part of the cap layer, the first masking portion, and the second masking portion to form a first liner, a second liner, and a sustaining cover disposed to interconnect the first liner and the second liner so as to cover the air gap, the first liner covering an upper portion of a lateral surface of the first conductive portion, the second liner covering an upper portion of a lateral surface of the second conductive portion facing the lateral surface of the first conductive portion.

13. The method according to claim 12, wherein
lower parts of the two opposite wall portions of the cap layer on the first feature remain after the upper part of the cap layer is removed, so as to form a pair of the first liners covering upper portions of two opposite lateral surfaces of the first conductive portion, respectively;
lower parts of the two opposite wall portions of the cap layer on the second feature remain after the upper part of the cap layer is removed, so as to form a pair of the second liners covering upper portions of two opposite lateral surfaces of the second conductive portion, respectively; and
a lower part of the sustaining layer remains after the upper part of the sustaining layer is removed, so as to form the sustaining cover.

14. The method according to claim 12, wherein the first conductive portion, the second conductive portion, the first liner, and the second liner are formed, so that a spacing distance between the first conductive portion and the second conductive portion is larger than a spacing distance between the first liner and the second liner by a distance which is equal to a total thickness of the first liner and the second liner.

15. The method according to claim 12, wherein
the first liner is formed to extend downwardly from a top surface of the first conductive portion by a length ranging from one-third to one-half of a height of the first conductive portion; and
the second liner is formed to extend downwardly from a top surface of the second conductive portion by a length ranging from one-third to one-half of a height of the second conductive portion.

16. The method according to claim 12, wherein the first liner, the second liner, and the sustaining cover are formed, so that the sustaining cover has a thickness less than a length of each of the first liner and the second liner in the normal direction.

17. A method for manufacturing a semiconductor device, comprising:
forming a patterned layer over a substrate, the patterned layer including a first feature and a second feature which extend upwardly in a normal direction transverse to the substrate and which are spaced apart from each other by a recess, the first feature including a first conductive portion and a first masking portion disposed on the first conductive portion, the second feature including a second conductive portion and a second masking portion disposed on the second conductive portion;
directionally depositing a dielectric material upon the first feature and the second feature at an inclined angle relative to the normal direction so as to form a cap layer on each of the first feature and the second feature, the cap layer including a top portion disposed on a top surface of each of the first feature and the second feature, and two opposite wall portions extending downwardly from two opposite ends of the top portion to cover upper portions of two opposite lateral surfaces of each of the first feature and the second feature such that a lower portion of each of the first feature and the second feature is exposed from the cap layer to the recess, the cap layer on the first feature being disconnected from the cap layer on the second feature;
forming a sacrificial feature in the recess between the first feature and the second feature, the sacrificial feature having a height less than a height of each of the first feature and the second feature;
forming a sustaining layer to cover the sacrificial feature;
removing the sacrificial feature to form an air gap confined by the sustaining layer and the first feature and the second feature; and
removing an upper part of the sustaining layer, an upper part of the cap layer, the first masking portion, and the second masking portion to form a first liner, a second liner, and a sustaining cover disposed to interconnect the first liner and the second liner so as to cover the air gap, the first liner covering an upper portion of a lateral surface of the first conductive portion, the second liner covering an upper portion of a lateral surface of the second conductive portion facing the lateral surface of the first conductive portion.

18. The method according to claim 17, wherein directionally depositing the dielectric material includes:
- directionally depositing the dielectric material upon the first feature and the second feature at a first orientation relative to the normal direction and at the inclined angle of greater than 0 degrees and less than 90 degrees, so as to form a first cap portion including a first top segment disposed on the top surface of each of the first feature and the second feature, and a first wall segment extending downwardly from an end of the first top segment to cover an upper portion of a first lateral surface of each of the first feature and the second feature; and
- directionally depositing the dielectric material upon the first feature and the second feature at a second orientation counter to the first orientation relative to the normal direction and at the inclined angle of greater than 0 degrees and less than 90 degrees, so as to form a second cap portion including a second top segment disposed on the first top segment, and a second wall segment extending downwardly from an end of the second top segment to cover an upper portion of a second lateral surface of each of the first feature and the second feature opposite to the first lateral surface.

19. The method according to claim 17, wherein the air gap has a width, and the first liner and the second liner are spaced apart from each other by a spacing distance which is less than the width of the air gap.

20. The method according to claim 19, wherein the width of the air gap is equal to a total value of a thickness of the first liner, a thickness of the second liner, and a width of the sustaining cover.

* * * * *